United States Patent
Lee et al.

(10) Patent No.: US 8,546,880 B2
(45) Date of Patent: Oct. 1, 2013

(54) ANTI PUNCH-THROUGH LEAKAGE CURRENT METAL-OXIDE-SEMICONDUCTOR TRANSISTOR AND MANUFACTURING METHOD THEREOF

(75) Inventors: Chun-Yao Lee, Taipei County (TW); Chin-Lung Chen, Hsinchu County (TW); Wei-Chun Chang, Kaohsiung (TW); Hung-Te Lin, Hsinchu County (TW); Han-Min Huang, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 394 days.

(21) Appl. No.: 12/943,114

(22) Filed: Nov. 10, 2010

(65) Prior Publication Data

US 2012/0112276 A1    May 10, 2012

(51) Int. Cl.
*H01L 29/78* (2006.01)
(52) U.S. Cl.
USPC .......................................... 257/336; 257/337
(58) Field of Classification Search
USPC .......... 257/336, 497, 498, E21.437, E29.256; 438/286
See application file for complete search history.

(56) References Cited

U.S. PATENT DOCUMENTS

| 2005/0067655 A1* | 3/2005 | Shibib et al. | 257/344 |
| 2010/0032757 A1* | 2/2010 | Pendharkar | 257/337 |
| 2010/0140699 A1* | 6/2010 | Ko | 257/337 |

FOREIGN PATENT DOCUMENTS

TW        200721489        6/2007

* cited by examiner

*Primary Examiner* — Marcos D. Pizarro
*Assistant Examiner* — Sue Tang
(74) *Attorney, Agent, or Firm* — Ding Yu Tan

(57) ABSTRACT

An anti punch-through leakage current MOS transistor and a manufacturing method thereof are provided. A high voltage deep first type well region and a first type light doping region are formed in a second type substrate. A mask with a dopant implanting opening is formed on the second type substrate. An anti punch-through leakage current structure is formed by implanting the first type dopant through the dopant implanting opening. A doping concentration of the first type dopant of the high voltage deep first type well region is less than that of the anti punch-through leakage current structure and greater than that of the high voltage deep first type well region. A second type body is formed by implanting a second type dopant through the dopant implanting opening. A gate structure is formed on the second type substrate.

11 Claims, 3 Drawing Sheets

ANTI PUNCH-THROUGH LEAKAGE CURRENT METAL-OXIDE-SEMICONDUCTOR TRANSISTOR AND MANUFACTURING METHOD THEREOF

FIELD OF THE INVENTION

The present invention relates to an anti punch-through leakage current metal-oxide-semiconductor (MOS) transistor and a manufacturing method thereof, and particularly to an anti punch-through leakage current MOS transistor and a manufacturing method thereof, which is applied to a fabrication of an integrated circuit.

BACKGROUND OF THE INVENTION

FIG. 1(a) illustrates a schematic view of a circuit unit of a conventional power management integrated circuit. Referring to FIG. 1(a), the circuit unit includes a P-type metal-oxide-semiconductor (PMOS) transistor array 11 and an N-type metal-oxide-semiconductor (NMOS) transistor array 12. In order to reduce an area of the circuit unit and a turn-on-resistance of a source/drain region, another NMOS transistor array 13 is usually used to replace the PMOS transistor array 11, as shown in FIG. 1(b). Each of the NMOS transistor array 12 and the NMOS transistor array 13 is comprised of a number of lateral diffused metal-oxide-semiconductor (LD-MOS) transistors. Thus, a P-type body 131 of the NMOS transistor array 13 will work in a condition of high voltage. As a result, a punch-through leakage current is easy to be generated in the circuit unit.

Therefore, what is needed is to an anti punch-through leakage current MOS transistor and a manufacturing method thereof to overcome the above disadvantages.

SUMMARY OF THE INVENTION

The present invention provides an anti punch-through leakage current MOS transistor and a manufacturing method thereof, which is applied to a fabrication of an integrated circuit and is capable of eliminating the anti punch-through leakage current.

The present invention provides a manufacturing method of an anti punch-through leakage current MOS transistor. The manufacturing method includes the following steps. A second type substrate is provided. A high voltage deep first type well region is formed in the second type substrate. A first type light doping region is formed in the high voltage deep first type well region in the second type substrate to form a drain structure. A doping concentration of a first type dopant of the first type light doping region is greater than a doping concentration of the first type dopant of the high voltage deep first type well region. A mask with a dopant implanting opening is formed on the second type substrate. An anti punch-through leakage current structure is formed in the high voltage deep first type well region by implanting the first type dopant through the dopant implanting opening. A doping concentration of the first type dopant of the anti punch-through leakage current structure is greater than a doping concentration of the first type dopant of the high voltage deep first type well region. A second type body is formed by implanting a second type dopant through the dopant implanting opening so as to form a source structure and a body structure. A location of the anti punch-through leakage current structure is deeper than a location of the second type body. The second type body and the second type substrate are separated by the high voltage deep first type well region and the anti punch-through leakage current structure. A gate structure is formed on the second type substrate. The gate structure connects between the second type body and the first type light doping region.

In one embodiment of the present invention, the second type substrate is a P-type silicon substrate, an isolating structure is formed on the P-type silicon substrate. The high voltage deep first type well region is a high voltage deep N-well region, and the first type light doping region is an N-type light doping region.

In one embodiment of the present invention, the manufacturing method further includes performing a thermal treatment process during forming the high voltage deep first type well region so as to drive the first dopant into the second type substrate deeply.

In one embodiment of the present invention, the manufacturing method further includes performing a thermal treatment process during forming the anti punch-through leakage current structure so as to drive the first dopant into the high voltage deep first type well region deeply.

In one embodiment of the present invention, an implanting energy of implanting the first type dopant to form the anti punch-through leakage current structure is higher than an implanting energy of implanting the second type dopant to form second type body.

In one embodiment of the present invention, the manufacturing method further includes the steps of: forming a first type heavy doping region in the second type body to form a contact area of a source structure, forming a first type heavy doping region in the first type light doping region to form a contact area of a drain structure; and forming a second type heavy doping region in the second type substrate to form a grounding contact area.

In one embodiment of the present invention, the location of the anti punch-through leakage current structure is deeper than the location of the second type body, and is far away from a bottom of the second type body and near to a bottom of the high voltage deep first type well region.

In one embodiment of the present invention, the location of the anti punch-through leakage current structure is deeper than the location of the second type body, and a distance between the anti punch-through leakage current structure and a bottom of the second type body is equal to a distance between the anti punch-through leakage current structure and a bottom of the high voltage deep first type well region.

In one embodiment of the present invention, the substrate is a N-type silicon substrate, an isolating structure is formed on the N-type silicon substrate, the high voltage deep first type well region is a high voltage deep P-well region, and the first type light doping region is an P-type light doping region.

The present invention also provides an anti punch-through leakage current MOS transistor including a second type substrate, a first type light doping region, a second type body, an anti punch-through leakage current structure and a gate structure. The second type substrate has a grounding region. The first type light doping region is formed in the second type substrate so as to form a drain structure. The second type body is separately formed at a side of the first type light doping region so as to form a source structure and a body structure. The gate structure is located on the second type substrate and connects between the second type body and the first type light doping region. The anti punch-through leakage current structure is located between the second type body and the grounding region. A location of the anti punch-through leakage current structure is deeper than a location of the second type body.

In one embodiment of the present invention, the anti punch-through leakage current MOS transistor further includes a high voltage deep first type well region. The high voltage deep first type well region is located between the grounding region of the second type substrate and the first type light doping region and the second type body, and is configured for separating the second type substrate and the second type body.

In one embodiment of the present invention, the location of the anti punch-through leakage current structure is deeper than the location of the second type body, and is far away from a bottom of the second type body and near to a bottom of the high voltage deep first type well region.

In one embodiment of the present invention, the location of the anti punch-through leakage current structure is deeper than the location of the second type body, and a distance between the anti punch-through leakage current structure and a bottom of the second type body is equal to a distance between the anti punch-through leakage current structure and a bottom of the high voltage deep first type well region.

In one embodiment of the present invention, the second type body and the second type substrate are separated by the high voltage deep first type well region.

In one embodiment of the present invention, the second type substrate is a P-type silicon substrate, and an isolating structure is formed on the P-type silicon substrate. The high voltage deep first type well region is a high voltage deep N-well region. The first type light doping region is an N-type light doping region, and the second type body is a P-type body.

In one embodiment of the present invention, the P-type body includes a plurality of N-type heavy doping regions formed therein to fabricate a plurality of contact areas of a source structure.

In one embodiment of the present invention, the P-type body includes a P-type heavy doping region formed therein to separate the plurality of N-type heavy doping regions.

In one embodiment of the present invention, the N-type light doping region includes a plurality of N-type heavy doping regions to fabricate a plurality of contact areas of a drain structure.

In one embodiment of the present invention, the anti punch-through leakage current MOS transistor further includes a plurality of MOS transistors arranging in an array.

In one embodiment of the present invention, the second type substrate is a N-type silicon substrate, an isolating structure is formed on the N-type silicon substrate, the high voltage deep first type well region is a high voltage deep P-well region, the first type light doping region is an P-type light doping region, and the second type body is a P-type body.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
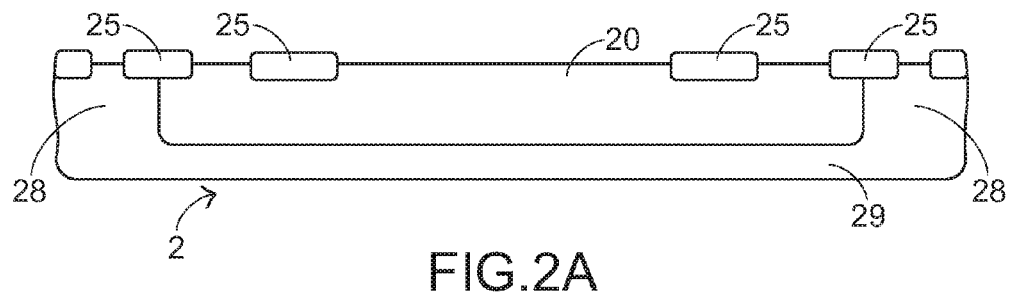
FIGS. 2(a)-2(f) illustrate a process flow of forming an anti punch-through leakage current MOS transistor in accordance with an embodiment of the present invention.
Figure 2B:
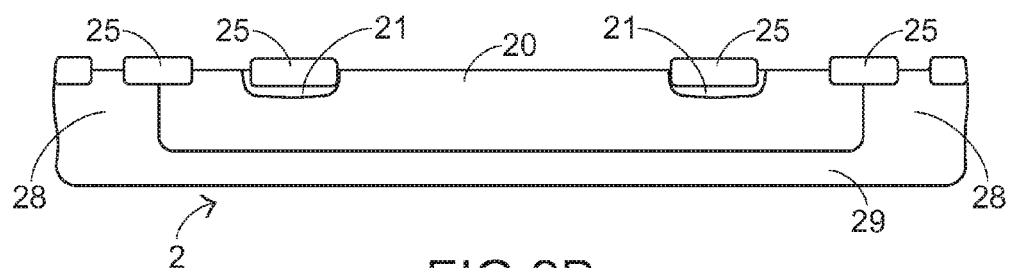

FIGS. 2(a)-2(f) illustrate a process flow of forming an anti punch-through leakage current MOS transistor in accordance with an embodiment of the present invention. Referring to FIG. 2(a), a second type substrate is provided. A high voltage deep first type well region is formed in the second type substrate by using a first photolithography process and a first dopant implantation process. If the first type is N-type, the second type is P-type; if the first type is P-type, the second type is N-type. In the present embodiment, for example, a P-type silicon substrate 2 is provided. An a plurality of isolating structures 25 are respectively formed in a plurality of specific regions of the P-type silicon substrate 2. A high voltage deep N-well (HVDNW) region 20 is formed in the P-type silicon substrate 2. In order to make the N-type dopant (i.e., the first type dopant) be deeply located in the P-type silicon substrate 2 (i.e., the second type substrate), after the first dopant implantation process, a thermal treatment process can be performed to drive the N-type dopant in the P-type silicon substrate 2 to arrive at a deeper location. Each of the isolating structures 25 can be a field oxide or a shallow trench isolation (STI). Additionally, a P-well 28 can be formed around the high voltage deep N-well region 20. Thus, the high voltage deep N-well region 20 can be isolated from other components by the P-well 28.

Next, a plurality of first type light doped regions (also called first type drift regions) are formed in a plurality of specific regions of the second type substrate by using a second photolithography process and a second dopant implantation process. In the present embodiment, referring to FIG. 2(b), two N-type light doped regions 21 is formed in the high voltage deep N-well region 20 in the P-type silicon substrate 2 so as to form a drain structure. A doping concentration of the N-type dopant of the N-type light doped regions 21 is greater than a doping concentration of the N-type dopant of the high voltage deep N-well region 20.

Figure 2C:
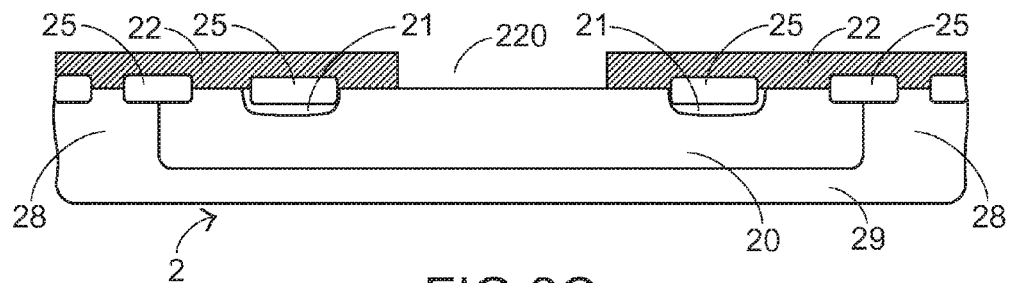

Next, referring to FIG. 2(c), a mask 22 with a dopant implanting opening 220 is formed on the P-type silicon substrate 2 by using a third photolithography process. In the present embodiment, the dopant implanting opening 220 is located between the two N-type light doped regions 21 so as to expose the P-type silicon substrate 2 between the two N-type light doped regions 21 from the mask 22. The following two dopant implantation processes will be performed through the dopant implanting opening 220.

Figure 2D:
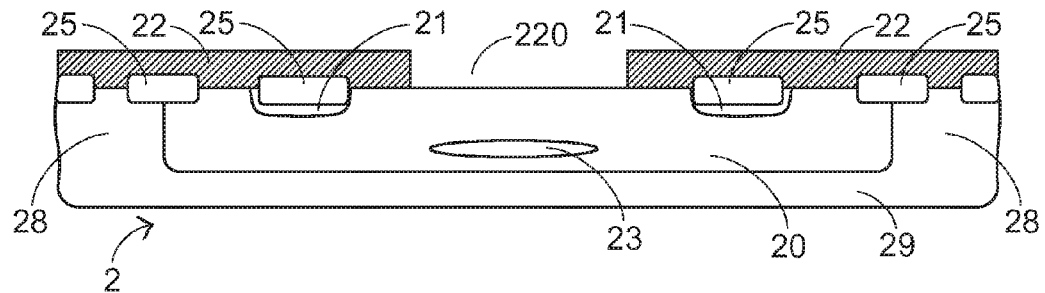

Next, referring to FIG. 2(d), a third dopant implantation process is performed through the dopant implanting opening 220 to implant the first type dopant. In the present embodiment, an anti punch-through leakage current structure 23 is formed in the high voltage deep N-well region 20 by implanting the N-type dopant through the dopant implanting opening 220. An implanting energy of the third dopant implantation process is higher than an implanting energy of a subsequent fourth dopant implantation process. Thus, a location of the anti punch-through leakage current structure 23 is deeper than a location of a subsequent P-type body 24 in the high voltage deep N-well region 20. Moreover, a doping concentration of the N-type dopant of the anti punch-through leakage current structure 23 is greater than a doping concentration of the high voltage deep N-well region 20. For example, the implanting energy of the high voltage deep N-well region 20 is about 2500 kiloelectron volts (keVs), and the doping concentration of the high voltage deep N-well region 20 is about 1.2E12 $cm^{-2}$. The implanting energy of the first type light doped regions is about 150 keVs, and the doping concentration of the first type light doped regions is about $2.9E12\ cm^{-2}$. The implanting energy of the third dopant implantation process for forming the anti punch-through leakage current structure 23 is about 1300 keVs, and the doping concentration of the third dopant implantation process for forming the anti punch-through leakage current structure 23 is about $2.0E12\ cm^{-2}$. The implanting energy of the subsequent fourth dopant implantation process for forming the subsequent P-type body 24 is about 180 keVs, and the doping concentration of the subsequent fourth dopant implantation process for forming the subsequent P-type body 24 is about $2.5E13\ cm^{-2}$. In order to make the N-type dopant (i.e., the first type dopant) be deeply located in the high voltage deep N-well region 20, after the third dopant implantation process, a thermal treatment process can also be performed to drive the N-type dopant in the high voltage deep N-well region 20 to arrive at a deeper location.

Figure 2E:
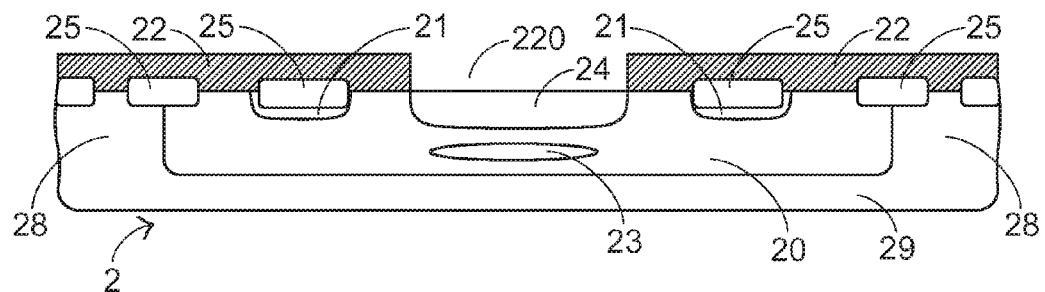

Referring to FIG. 2(e), a fourth dopant implantation process is performed to implant the second type dopant through the dopant implanting opening 220 to form a second type body. In the present embodiment, a P-type body 24 is formed between the two N-type light doping regions 21 and is formed above the anti punch-through leakage current structure 23 in the high voltage deep N-well region 20. The P-type body 24 is adjacent to a top surface (not labeled) of the P-type silicon substrate 2. The P-type body 24 is configured for fabricating a source structure and a body structure. The location of the anti punch-through leakage current structure 23 is deeper than the location of the P-type body 24, and is far away from a bottom of the P-type body 24 and near to a bottom of the high voltage deep N-well region 20. In another embodiment, a distance between the anti punch-through leakage current structure 23 and a bottom of the P-type body 24 is equal to a distance between the anti punch-through leakage current structure 23 and a bottom of the high voltage deep N-well region 20.

Figure 1A:
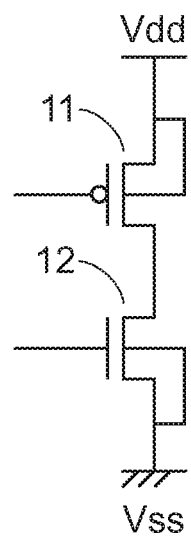
FIG. 1(a) illustrates a schematic view of a circuit unit of a conventional power management integrated circuit.
Figure 1B:
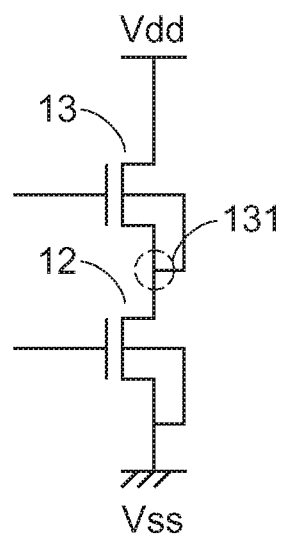
FIG. 1(b) illustrates a schematic view of another circuit unit of a conventional power management integrated circuit.
Figure 2F:
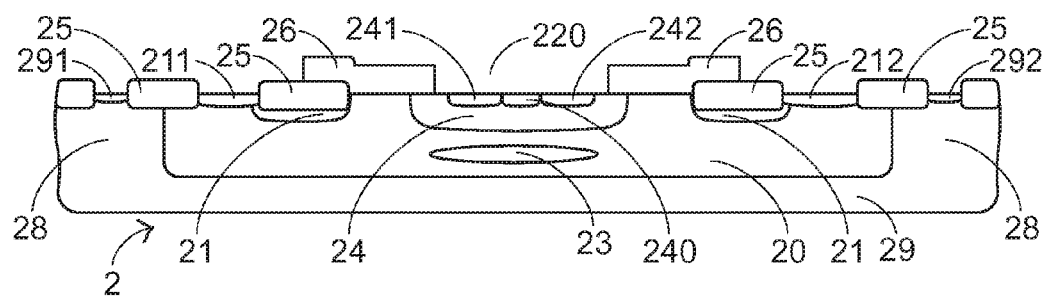

Next, a series of subsequent processes can be performed to fabricate the MOS transistor with two lateral diffused MOS transistors back to back, as shown in FIG. 2(f). For example, two first type heavy doping regions and a second type heavy doping region are formed in the second type body. In the present embodiment, two N-type heavy doping regions 241, 242 are formed in the P-type body 24 to form two contact areas of the source structure. The P-type heavy doping region 240 is located between the two N-type heavy doping regions 241, 242 to separate the two N-type heavy doping regions 241, 242. A gate structure 26 is formed between the P-type body 24 and the isolating structure 25. The gate structure 26 connects between the P-type body 24 and the N-type light doping region 21. In the present embodiment, the two N-type light doped regions 21 and the P-type body 24 are separated. Additionally, two first type heavy doping regions are formed in the two first type light doped regions respectively. In the present embodiment, two N-type heavy doping regions 211, 212 are formed in the two N-type light doped regions 21 respectively so as to form two contact areas of a drain structure. Further, two second type heavy doping regions are formed in the second type substrate outside the high voltage deep first type well region. In the present embodiment, two P-type heavy doping regions 291, 292 are formed in the P-type silicon substrate 2 outside the high voltage deep N-type well region 20. The two P-type heavy doping regions 291, 292 serve as two grounding contact areas of a grounding region 29. As a result, the N-type MOS transistors 13 as shown in FIG. 1(b) is formed and arranged in an array. Because the anti punch-through leakage current structure 23 is formed in the high voltage deep N-type well region 20, the lateral diffused MOS transistors can have an excellent anti punch-through leakage current property and have an identical drain side breakdown voltage (BVD).

Furthermore, the anti punch-through leakage current structure 23 and the P-type body 24 can be formed by using the common dopant implanting opening of the mask 22. Thus, the number of the mask will not be increased. In addition, the P-type body 24 can be formed before forming the anti punch-through leakage current structure 23. It is noted that, the two dopant implantation processes of forming the anti punch-through leakage current structure 23 and the P-type body 24 should be performed after the thermal treatment process. Thus, the doping concentration of the N-type dopant of the anti punch-through leakage current structure 23 and the P-type body 24 will not affect and will not change.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An anti punch-through leakage current MOS transistor, comprising:
   a second type substrate having a grounding region;
   a high voltage deep first type well region formed in the second type substrate;
   a first type light doping region formed in the high voltage deep first type well region so as to form a drain structure;
   a second type body formed in the high voltage deep first type well region and separately located at a side of the first type light doping region so as to form a source structure and a body structure;
   a gate structure on the second type substrate, the gate structure connecting between the second type body and the first type light doping region; and
   an anti punch-through leakage current structure formed in the high voltage deep first type well region and between the second type body and the grounding region, a location of the anti punch-through leakage current structure being deeper than a location of the second type body.

2. The anti punch-through leakage current MOS transistor as claimed in claim 1, wherein the high voltage deep first type well region is located between the grounding region and the first type light doping region and the second type body, and is configured for separating the second type substrate and the second type body.

3. The anti punch-through leakage current MOS transistor as claimed in claim 2, wherein the location of the anti punch-through leakage current structure is deeper than the location of the second type body, and a distance between the anti punch-through leakage current structure and a bottom of the second type body is greater than a distance between the anti punch-through leakage current structure and a bottom of the high voltage deep first type well region.

4. The anti punch-through leakage current MOS transistor as claimed in claim 2, wherein the location of the anti punch-through leakage current structure is deeper than the location of the second type body, and a distance between the anti punch-through leakage current structure and a bottom of the second type body is equal to a distance between the anti punch-through leakage current structure and a bottom of the high voltage deep first type well region.

5. The anti punch-through leakage current MOS transistor as claimed in claim 2, wherein the second type body and the second type substrate are separated by the high voltage deep first type well region.

6. The anti punch-through leakage current MOS transistor as claimed in claim 2, wherein the second type substrate is a P-type silicon substrate, an isolating structure is formed on the P-type silicon substrate, the high voltage deep first type well region is a high voltage deep N-well region, the first type light doping region is an N-type light doping region, and the second type body is a P-type body.

7. The anti punch-through leakage current MOS transistor as claimed in claim 6, wherein the P-type body comprises a plurality of N-type heavy doping regions formed therein to fabricate a plurality of contact areas of a source structure.

8. The anti punch-through leakage current MOS transistor as claimed in claim 7, wherein the P-type body comprises a P-type heavy doping region formed therein to separate the N-type heavy doping regions.

9. The anti punch-through leakage current MOS transistor as claimed in claim 6, wherein the N-type light doping region comprises a plurality of N-type heavy doping regions to fabricate a plurality of contact areas of a drain structure.

10. The anti punch-through leakage current MOS transistor as claimed in claim 1, further comprising a plurality of MOS transistors disposed on the second type substrate and arranged in an array.

11. The anti punch-through leakage current MOS transistor as claimed in claim 1, wherein the second type substrate is a N-type silicon substrate, an isolating structure is formed on the N-type silicon substrate, the high voltage deep first type well region is a high voltage deep P-well region, the first type light doping region is an P-type light doping region, and the second type body is a P-type body.

* * * * *